United States Patent [19]

Hamasaki

[11] Patent Number: 5,285,091
[45] Date of Patent: Feb. 8, 1994

[54] SOLID STATE IMAGE SENSING DEVICE
[75] Inventor: Masaharu Hamasaki, Kanagawa, Japan
[73] Assignee: Sony Corporation, Tokyo, Japan
[21] Appl. No.: 865,487
[22] Filed: Apr. 9, 1992
[30] Foreign Application Priority Data
Apr. 10, 1991 [JP] Japan .................................. 1-06667
[51] Int. Cl.⁵ ...................... H01L 31/06; H01L 27/14
[52] U.S. Cl. .................................. 257/292; 257/290; 257/291; 257/230; 257/444; 257/445
[58] Field of Search ...................... 250/208.1; 257/290, 257/291, 292, 230, 444, 445

[56] References Cited

PUBLICATIONS

*IEDM* Nakamura et al "A New MOS Image Sensor . . . Mode" 1986 Los Angeles, Calif. Dec. 7–10, 1986.

*Primary Examiner*—Jerome Jackson
*Attorney, Agent, or Firm*—Hill, Steadman & Simpson

[57] ABSTRACT

A solid state image sensing device has a plurality of photo sensing elements arranged in a two-dimensional fashion at pixel units pixel unit in the horizontal and vertical directions. Each of the plurality of photo sensing elements is formed of a vertical selection transistor whose gate electrode is connected to a horizontal selection line and whose source electrode is connected to a vertical signal line. A photoelectric conversion element is provided under a channel region of the vertical selection transistor. A high concentration impurity is buried in lower portions of the source electrode and the channel region. When a voltage is applied to the source electrode, a signal charge which is subjected to a photoelectric conversion by the photoelectric conversion element is reset. Reset noise, Vth irregularity, smear component and the surface dark current can be reduced and blooming is suppressed.

10 Claims, 4 Drawing Sheets under the gate electrode, whereby the hole in the channel region is drained in the direction towards the drain region and then flows to the substrate through a hole over-flow drain. Then, the vacant pixel is read once again. By this CDS (Correlation Double Sampling) operation, a signal component from which the Vth

SOLID STATE IMAGE SENSING DEVICE

BACKGROUND OF THE INVENTION

1. Field of the Invention

The present invention relates to a solid state image sensing device or CCD image sensing device and more particularly to a current output amplification type solid state image sensing device having an amplification function at every pixel thereof.

2. Description of the Related Art

In the prior art, as a current output amplification type solid state image sensing device, there have been proposed an AMI (Amplified MOS Intelligent) type solid state image sensing device having an amplifier circuit assembled in a unit pixel thereof, a CMD (Charge Modulation Device) type solid state image sensing device in which each pixel is formed of a MOS photo transistor and so on.

Of the current output amplification type solid state image sensing devices, the AMI type solid state image sensing device has the problems of reset noise and threshold voltage (Vth) irregularity, while the CMD type solid state image sensing device, there are the problems of a blooming and surface dark current.

OBJECTS AND SUMMARY OF THE INVENTION

Accordingly, it is an object of the present invention to provide a solid state or CCD image sensing device which can reduce the reset noise, Vth irregularity, smear component and the surface dark current.

It is another object of the present invention to provide a solid state sensing device which can suppress the generation of blooming.

According to an aspect of the present invention, there is provided a solid state image sensing device which comprises a plurality of photo sensing elements arranged in two-dimensional fashion at pixel units in the horizontal and vertical directions, each of the plurality of photo sensing elements being formed of a vertical selection transistor whose gate electrode is connected to a horizontal selection line and whose source electrode is connected to a vertical signal line. A photoelectric conversion element is provided under a channel region of the vertical selection transistor. An impurity of high concentration is buried in lower portions of the source electrode and said channel region. When a voltage is applied to the source electrode, a signal charge which is subjected to a photoelectric conversion by the photoelectric conversion element is reset.

According to the above solid state image sensing device of the present invention, the gate electrode of the vertical selection transistor in the selected pixel has applied thereto an intermediate voltage of about 3.5 V, and the source electrode thereof has applied thereto about 2 V, respectively. A current in proportion to the number of holes stored in the portion under the gate electrode of the vertical selection transistor in the selected pixel flows therethrough. Then, the source electrode of the transistor in the selected pixel is selected to be about 8 V and a voltage is applied to the portion irregularity and smear component are removed can be detected. Furthermore, all the pixels are turned on during the horizontal blanking period and electron are injected into the surface channel region at every horizontal scanning period. Accordingly, the electrons are input to the surface level and hence the surface dark current can be suppressed.

The preceding and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENT

An embodiment of the solid state image sensing device or CCD image sensing device according to the present invention will be described with reference to the accompanying drawings.

Figure 1:
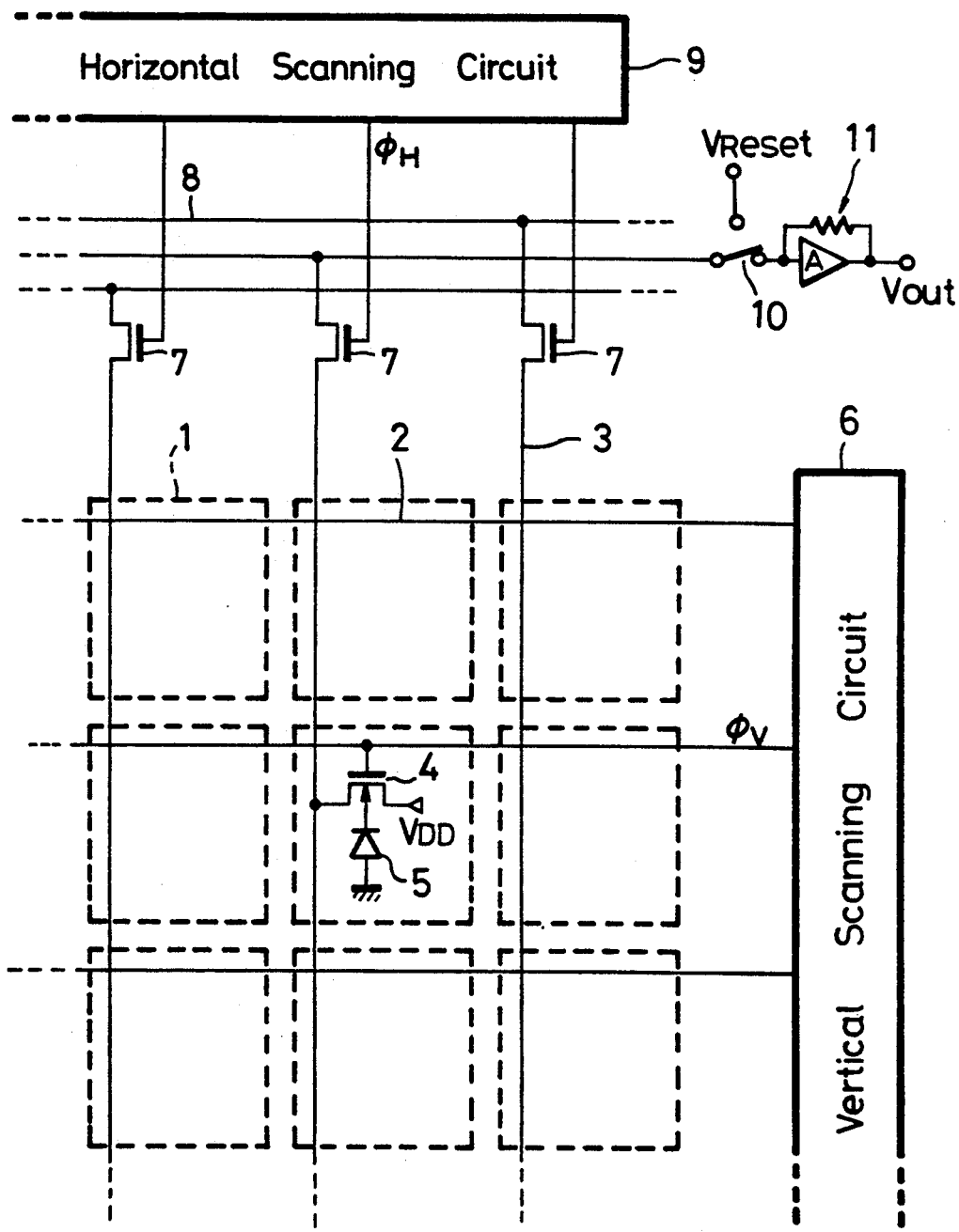
FIG. 1 is a circuit diagram showing a main portion of an embodiment of the solid state image sensing device according to the present invention.

FIG. 1 is a circuit diagram showing a main part of the embodiment of the solid state image sensing device according to the present invention. In FIG. 1, for the sake of explanation, a plurality of pixels are arranged in two-dimensional fashion or matrix fashion in the horizontal and vertical directions. A circuit configuration of one pixel on a certain line is only shown, but the circuit configurations of the remaining pixels are all the same as that shown in FIG. 1.

In FIG. 1, in a photo sensor section 1 of a unit pixel, a vertical selection transistor 4 is provided whose gate electrode is connected to a horizontal selection line 2 and whose source electrode is connected to a vertical signal line 3. A photo diode 5 which serves as a photoelectric conversion element is formed in a channel region of the vertical selection transistor 4.

In the photo sensor section 1 thus formed, a power source voltage $V_{DD}$ (for example, 5 V) is applied to the drain electrode of the vertical selection transistor 4 as a fixed voltage, while a vertical scanning pulse $\phi_v$ is supplied to its gate electrode from a vertical scanning circuit 6 through the horizontal selection line 2 to thereby select a horizontal line. Then, when one horizontal line 2 is selected, a signal charge stored in the photo diode 5 of the pixel on the selected horizontal line 2 in response to incident light thereon is amplified by the vertical transistor 4 and then output to the vertical signal line 3.

The output signal delivered to the vertical signal line 3 is supplied as a current output to a horizontal signal line 8 by the switching operation of a horizontal gate switch 7 which is controlled in its switching operation by a horizontal shift pulse $\phi_H$ derived from a horizontal scanning circuit 9. The current output delivered to the horizontal signal line 8 is delivered through a change-over switch 10 and an amplifier 11 as a voltage output $V_{out}$. The change-over switch 10 selectively applies a reset voltage $V_{Reset}$ (for example, 8 V to the horizontal signal line 8.

Figure 2:
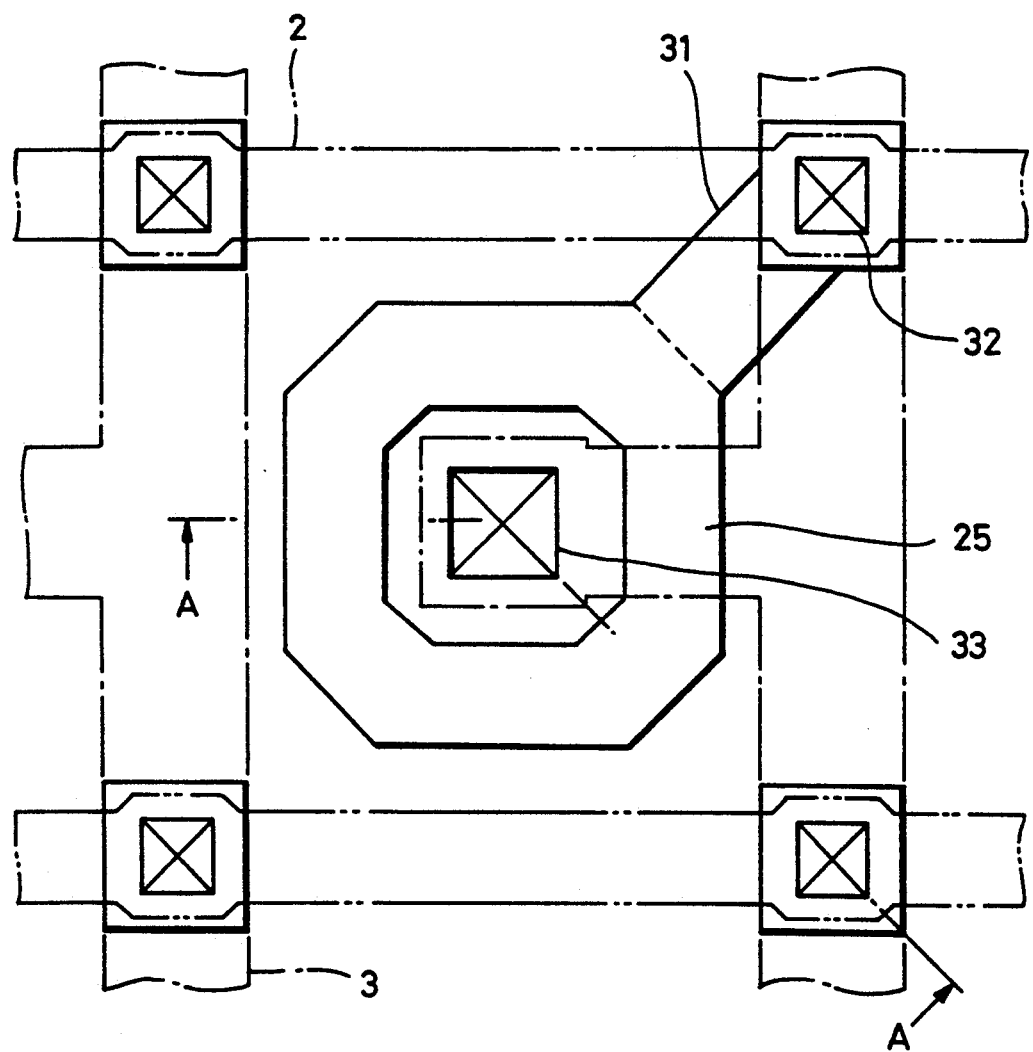
FIG. 2 is a plan view showing the structure of a unit cell thereof.
Figure 3:
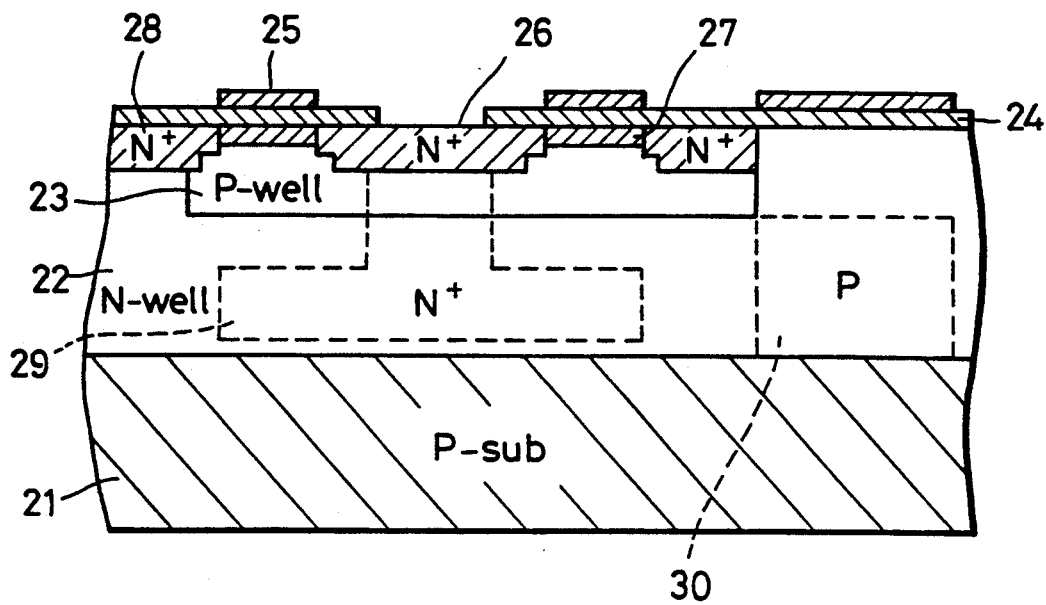
FIG. 3 is a cross-sectional view taken along a line A—A in FIG. 2.

FIG. 2 is a plan view showing the structure of one cell (unit pixel) and FIG. 3 is a cross-sectional view taken along the line A—A of FIG. 3 and viewed along the direction of the arrows in FIG. 2.

Referring to FIG. 3, on the surface of a P-type silicon substrate 21 there is formed an N-type well 22 on which a P-type well 23 is further formed. On the P-type well 23 there is formed through a silicon dioxide film ($SiO_2$) 24 a transparent gate electrode 25 which is made of polysilicon and whose shape is a ring as shown in FIG. 2. An N+-type source region 26 is formed beneath and within the gate electrode 25 and on the surface side of the P-type well 23. An N-type channel region 27 is formed at the position opposing the gate electrode 25 around the source region 26, and an N+-type drain region 28 is formed around the channel region 27. The above-mentioned vertical selection transistor 4 is formed by the elements mentioned directly above.

An N+-type impurity region 29 is buried in the portions under the source and channel regions 26 and 27. When a voltage is applied through the source region 26 to the N+-type impurity region 29, it biases the lower portion of channel region 27 to thereby drain the holes stored in the lower portion of channel region 27 by photoelectric conversion in the direction towards the drain region 28. The holes drained to the drain region 28 flow to the substrate 21 through a hole over-flow drain 30 Between the hole over-flow drain 30 and the gate electrode 25, there is formed an over-flow control section 31 having a suitable barrier against the holes as shown in FIG. 2. In this embodiment, to the gate electrode 25 there is connected the horizontal selection line 2 through a contact 32 and the over-flow control section 31, while to the source region 26 there is connected the vertical signal line 3 through a contact 33.

Figure 4:
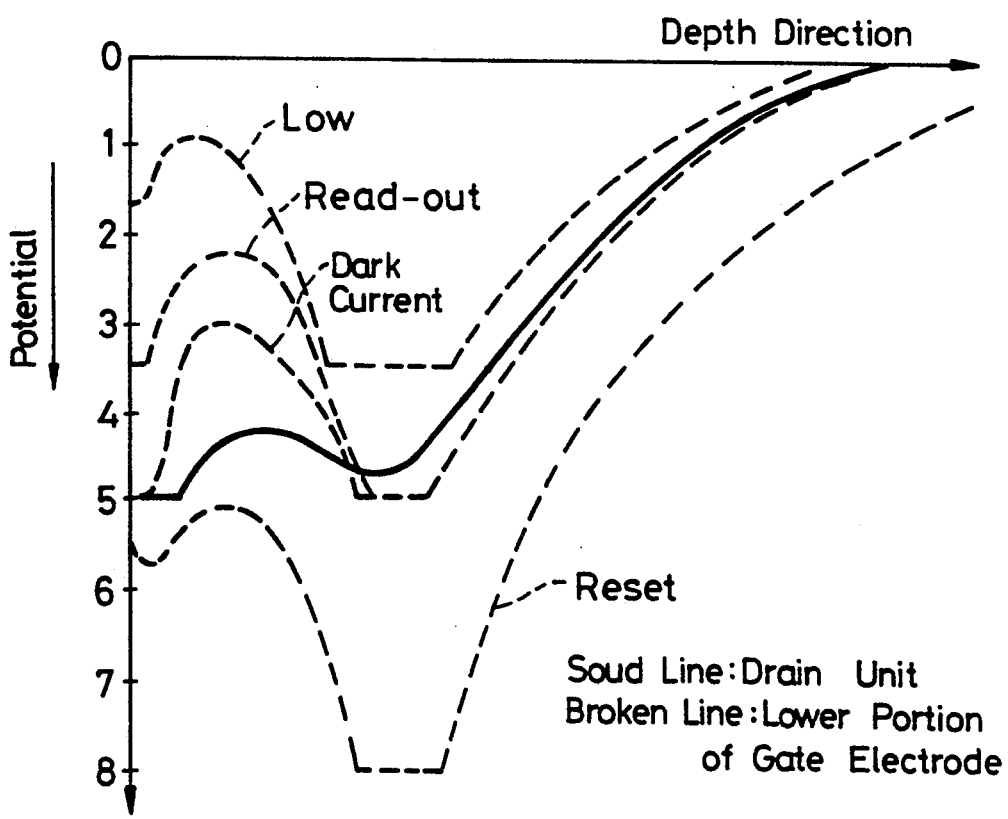
FIG. 4 is a graph showing a potential distribution of a drain region (solid line) and the portion beneath a gate electrode at respective operation states.
Figure 5A:
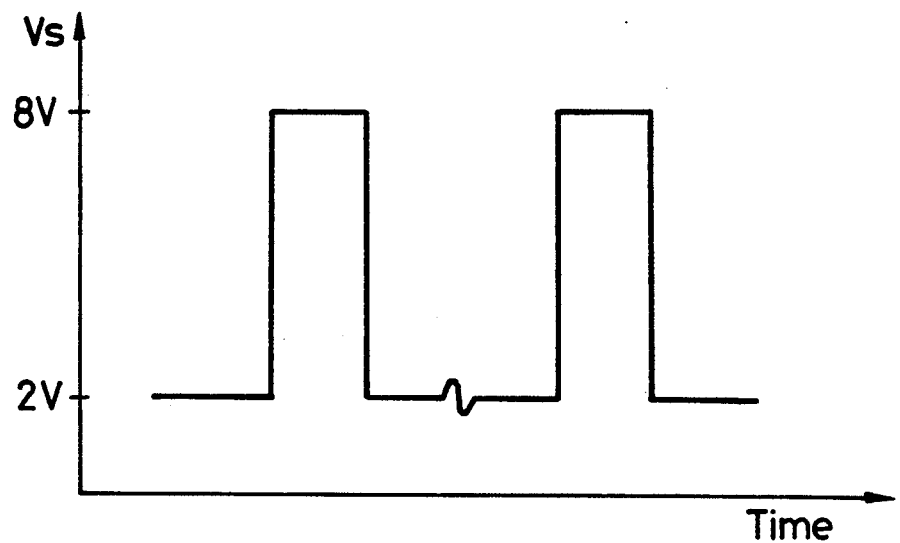
FIGS. 5A and 5B are waveform diagrams used to explain the operation of the present invention.
Figure 5B:
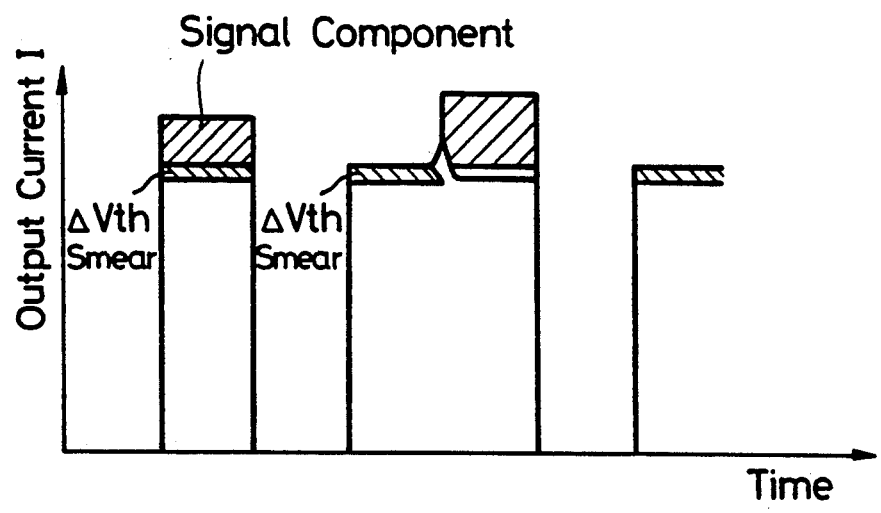

The operation of the unit cell formed as described above will be explained with reference to FIG. 4, which is a potential distribution graph, and to FIGS. 5A and 5B which are wave form diagrams. In FIG. 4, a solid line curve represents the potential distribution of the drain region 28, while a broken line curve shows the potential distribution beneath the gate electrode 25, respectively. FIG. 5A shows the wave form of a source voltage $V_S$, while FIG. 5B represents the wave form of an output current I, respectively.

The holes generated by the photoelectric conversion are accumulated in the lower portion of the channel region 27 beneath the gate electrode 25. In that state, the vertical selection transistor 4 of the pixel which is not selected is operated in a low (LOW) state by applying a low (L) level (for example, 0 V) to its gate electrode, while an intermediate level of voltage such as about 3.5 V is applied to the gate electrode of the vertical selection transistor 4 of the selected pixel through the horizontal selection line 2. A voltage, for example, of about 2 V is applied to its source electrode by the external amplifier 11 (see FIG. 1), respectively, as shown in FIG. 5A. Thus, a current modulation is caused dependent on the number of holes stored in the lower portion of channel region 27 under the gate electrode 25 of vertical selection transistor 4 of the selected pixel such that a current proportional to the hole number flows. This output current includes Vth (threshold voltage) irregularity and smear components in addition to a signal component as shown in FIG. 5B.

Then, a voltage of about 8 V is applied to the source region 26 of vertical selection transistor 4 of the pixel selected through the vertical signal line 3 by selecting the reset voltage $V_{Reset}$ by the change-over switch 10 to thereby bias the lower portion of the gate electrode 25 through the N+-type impurity region 29. Thus, the holes in the channel region 27 are drained in the direction towards the drain region 28, namely, in the lateral direction. The hole drained in the drain region 28 flow to the substrate 21 through the hole over-flow drain 30, which is controlled by the over-flow control section 31. By this reset operation for the holes, the occurrence of blooming can be suppressed.

After the hole have been reset, the vacant pixel is read out again. At that time, since there is no signal component, only the Vth irregularity and smear components can be detected. Therefore, when the difference between the output currents before and after the reset is calculated, only the signal component from which the Vth irregularity and smear components are removed can be detected. Meanwhile, during the horizontal blanking period, if the source electrode is opened and all the gate electrodes are placed at an "H" level (for example, 5 V), all the pixels are turned ON, and at every horizontal scanning period electrons are injected to the surface channel region 27 (at this time, the potential of the source electrode becomes equal to that of the drain electrode), whereby the electrons are input to the surface level and hence the surface dark current is suppressed lower than 1/10.

According to the present invention as described above, at every photo sensor section of a pixel unit, there is provided a vertical selection transistor whose gate electrode is connected to the horizontal selection line and whose source electrode is connected to the vertical signal line. Under the channel region of the vertical selection transistor, there is provided the photoelectric conversion element, a of high concentration impurity is buried in the lower portions of the source electrode and the channel region of the vertical selection transistor, and the voltage is applied to the source electrode, whereby the signal charge which is subjected to the photoelectric conversion is reset. Thus, the Vth irregularity, reset noise and smear components can be reduced by the CDS operation. Furthermore, when all the pixels are turned ON during the horizontal blanking period and the electrons are injected to the surface level at every horizontal scanning period, the surface dark current can be reduced.

Having described the preferred embodiment of the invention with reference to the accompanying drawings, it is to be understood that the present invention is not limited to that precise embodiment, and that various changes and modifications thereof could be effected by one skilled in the art without departing from the spirit or scope of the novel concepts of the invention as defined in the appended claims.

What is claimed is:

1. A solid state image sensing device, comprising:
 a plurality of photo-sensing elements arranged in a two-dimensional fashion at respective pixel units in horizontal and vertical directions, each of said plurality of photo-sensing elements being formed of a vertical selection transistor whose gate electrode is connected to a horizontal selection line and whose source region is connected to a vertical signal line, and a photo-electric conversion element being provided at a channel region of said vertical selection transistor, said photo-electric conversion element creating a charge by photo-electric conversion when light is applied thereto;

impurity region means of high concentration in a relatively lower concentration region, said impurity region means being buried beneath and connected to said source region and also buried beneath said channel region for draining said charge from said photo-electric conversion element to a location under said drain region when a voltage is applied to said source region, the impurity region means being connected to said source region by an upwardly extending high concentration impurity region; and said charge comprising holes at a p-n junction of said photo-electric conversion element at a bottom of said channel region.

2. A solid state image sensing device, comprising:

a plurality of photo-sensing elements arranged in a two-dimensional fashion at respective pixel units in horizontal and vertical directions, each of said plurality of photo-sensing elements being formed of a vertical selection transistor whose gate electrode is connected to a horizontal selection line and whose sour e region is connected to a vertical signal line, and a photo-electric conversion element being provided at a channel region of said vertical selection transistor, said photo-electric conversion element creating a charge by photo-electric conversion when light is applied thereto;

impurity region means of high concentration buried beneath and connected to said source region and also buried beneath said channel region for draining said charge form said photo-electric conversion element to a location under said drain region when a voltage is applied to said source region; and said source region being of first conductivity type, a second conductivity type substrate is provided, said substrate having thereon a first well region of first conductivity type, a second well region of second conductivity type in said first well region, said source region being provided in said second well region, and said purity region means comprising a buried impurity region of first conductivity type in said fist well region beneath said source region and said channel region and extending up to said source region through said second well region.

3. A device according to claim 2 wherein a drain region of first conductivity type is provided alongside said channel region and a hole overflow drain region lying beneath an overflow control section is provided alongside and below said drain region in said first conductivity type first well region.

4. A device according to claim 2 wherein said photo-electric conversion element is a photo-diode.

5. A device according to claim 2 wherein said vertical selection transistor is formed of a p-type silicon substrate, an n-type well region formed thereon, a p-type well region formed on the n-type well region, said gate electrode comprising a ring-shaped transparent gate electrode formed on a silicon oxide film on said p-type well region, said source region comprising an n+-type source region formed within said ring-shaped gate electrode in said p-type well region, said channel region comprising an n-type channel region around said source region and beneath said gate electrode, and an n+-type drain region formed around said channel region.

6. A solid state image sensing device according to claim 5 wherein said impurity region means comprises an n+-type impurity region buried in said n-type well region below said source region and channel region.

7. A device according to claim 6 wherein an overflow drain region is formed between said drain region and said silicon substrate.

8. A device according to claim 7 wherein an overflow control section is formed above said overflow drain section and connected to said gate electrode.

9. A device according to claim 8 wherein said overflow control section is a barrier for holes.

10. A device according to claim 2 wherein said charge comprises holes at a p-n junction of said photo-electric conversion element at a bottom of said channel region.

* * * * *